United States Patent
Schmidt

(10) Patent No.: US 7,893,513 B2
(45) Date of Patent: Feb. 22, 2011

(54) NANOPARTICLE/NANOTUBE-BASED NANOELECTRONIC DEVICES AND CHEMICALLY-DIRECTED ASSEMBLY THEREOF

(75) Inventor: Howard K. Schmidt, Cypress, TX (US)

(73) Assignee: William Marsh Rice University, Houston, TX (US)

( * ) Notice: Subject to any disclaimer, the term of this patent is extended or adjusted under 35 U.S.C. 154(b) by 263 days.

(21) Appl. No.: 11/910,521

(22) PCT Filed: Feb. 2, 2007

(86) PCT No.: PCT/US2007/061563

§ 371 (c)(1),
(2), (4) Date: Oct. 2, 2007

(87) PCT Pub. No.: WO2008/060640

PCT Pub. Date: May 22, 2008

(65) Prior Publication Data

US 2010/0133513 A1    Jun. 3, 2010

Related U.S. Application Data

(60) Provisional application No. 60/764,636, filed on Feb. 2, 2006.

(51) Int. Cl.
*H01L 27/14* (2006.01)
(52) U.S. Cl. ............... 257/431; 977/712; 977/743; 977/806; 438/57
(58) Field of Classification Search ............. None
See application file for complete search history.

(56) References Cited

U.S. PATENT DOCUMENTS

| 4,445,050 | A | 4/1984 | Marks |
| 5,043,739 | A | 8/1991 | Logan et al. |
| 6,958,216 | B2 * | 10/2005 | Kelley et al. ............ 435/6 |

(Continued)

FOREIGN PATENT DOCUMENTS

WO    WO0103208    1/2001

(Continued)

OTHER PUBLICATIONS

PCT Search Report for international application No. PCT/US07/61563, mailed Jun. 6, 2008.

(Continued)

*Primary Examiner*—Jarrett J Stark
(74) *Attorney, Agent, or Firm*—Winstead PC

(57) ABSTRACT

According to some embodiments, the present invention provides a nanoelectronic device based on a nanostructure that may include a nanotube with first and second ends, a metallic nanoparticle attached to the first end, and an insulating nanoparticle attached to the second end. The nanoelectronic device may include additional nanostructures so a to form a plurality of nanostructures comprising the first nanostructure and the additional nanostructures. The plurality of nanostructures may arranged in a network comprising a plurality of edges and a plurality of vertices, wherein each edge comprises a nanotube and each vertex comprises at least one insulating nanoparticle and at least one metallic nanoparticle adjacent the insulating nanoparticle. The combination of at least one edge and at least one vertex comprises a diode. The device may be an optical rectenna.

18 Claims, 1 Drawing Sheet

U.S. PATENT DOCUMENTS

| | | | |
|---|---|---|---|
| 7,091,918 | B1 | 8/2006 | Bhansali et al. |
| 7,126,151 | B2 | 10/2006 | Estes et al. |
| 7,154,451 | B1 | 12/2006 | Sievenpiper |
| 2002/0172963 | A1* | 11/2002 | Kelley et al. ............ 435/6 |
| 2003/0185985 | A1 | 10/2003 | Bronikowski et al. |
| 2004/0028307 | A1 | 2/2004 | Diduck |
| 2005/0151126 | A1 | 7/2005 | Yamakawa et al. |
| 2006/0207647 | A1* | 9/2006 | Tsakalakos et al. ...... 136/256 |
| 2006/0293426 | A1 | 12/2006 | Curran et al. |
| 2010/0044074 | A1* | 2/2010 | Kim et al. ............ 174/126.2 |

FOREIGN PATENT DOCUMENTS

| | | |
|---|---|---|
| WO | WO0217362 | 2/2002 |
| WO | WO2004038767 | 5/2004 |

OTHER PUBLICATIONS

Berland, "Photovoltaic Technologies Beyond the Horizon: Optical Rectenna Solar Cell", U.S. Department of Energy Laboratory (2001-2002).

Bradley et al, "Electric Field Directed Construction of Diodes Using Free-standing Three-dimensional Components", Advanced. Materials (1999) 11, 5, 374-378.

Bradley et al, "Site selective electrodeposition of metals and conductive polymer nano-structures on isolated carbon nanopipes using electric fields", Mater. Res. Soc. Symp. Proc., (2004) 818, M12.6.1-M12.6.9.

Tans et al, "Room-temperature transistor based on a single carbon nanotube", Nature, vol. 393, pp. 49-52, May 7, 1998.

Lefebvre et al, "Single-wall carbon nanotube based devices", Carbon, 38 (2000), pp. 1745-1749.

Kymakis et al, "Single-wall carbon nanotube/conjugated polymer photovoltaic devices", Applied Physics Letters, vol. 80, No. 1, Jan. 7, 2002, pp. 112-114.

Baughman et al, "Carbon Nanotubes—the Route Toward Applications", Science, vol. 297, pp. 787-792, Aug. 2, 2002.

Keren et al, "DNA-Templated Carbon Nanotube Field-Effect Transistor", Science, vol. 302, pp. 1380-1382, Nov. 21, 2003.

Murakami et al, "Growth of vertically aligned single-walled carbon nanotube films on quartz substrates and their optical anisotrophy", Chemical Physics Letters, 385 (2004), pp. 298-303.

Murakami et al, "Direct synthesis of high-quality single-walled carbon nanotubes on silicon and quartz substrates", Chemical Physics Letters, 377 (2003) pp. 49-54.

Maruyama et al, "Low-temperature synthesis of high-purity single-walled carbon nanotubes from alcohol", Chemical Physics Letters, 360 (2002), pp. 229-234.

Chattopadhyay et al, "Metal-Assisted Organization of Shortened Carbon Nanotubes in Monolayer and Multilayer Firest Assemblies", J. Am. Chem. Soc. 123 (2001), pp. 9451-9452.

Fahlman et al, "CVD of Conformal Alumina Thin Films via Hydrolysis of AlH2 (NMe2Et)", Adv. Mater. Opt. Electron., 10 (2000), pp. 135-144.

* cited by examiner

NANOPARTICLE/NANOTUBE-BASED NANOELECTRONIC DEVICES AND CHEMICALLY-DIRECTED ASSEMBLY THEREOF

CROSS-REFERENCE TO RELATED APPLICATION

This application claims priority to and benefit of U.S. Provisional Application Ser. No. 60/764,636, filed on Feb. 2, 2006, entitled: CHEMICALLY-DIRECTED ASSEMBLY OF SWNT-BASED NANOELECTRONIC DEVICES, by inventor Howard K. Schmidt.

STATEMENT OF GOVERNMENT SPONSORSHIP

The present invention was made in part with United States Government support under a grant awarded by the Office of Naval Research, Grant No. N00014-04-1-0765 and the Department of Energy, Grant No. DE-FC36-05GO15073. The U.S. Government has certain rights in this invention.

FIELD OF THE INVENTION

The present invention relates in general to nanotube-based nanoelectronic devices and methods of making them, more particularly to chemically directed assembly of such devices.

BACKGROUND OF THE INVENTION

Rectennas—active antennas containing rectification devices—have been investigated in the microwave region for power transmission and detection over the past half century [W. C. Brown, "The History of Power Transmission by Radio Waves," *IEEE Trans. Microwave Theory and Techn.*, Vol. 32, No. 9, pp. 1230-1242, September 1984.]. Applications have included long distance power beaming [N. Shinohara, H. Matsumoto, "Experimental Study of Large Rectenna Array for Microwave Energy Transmission," *IEEE Trans. Microwave Theory and Techn.*, Vol. 46, No. 3, pp. 261-267, March 1998; S. S. Bharj, R. Camisa, S. Grober, F. Wosniak, E. Pendleton, "High-Efficiency C-band 1000-Element Rectenna Array for Microwave Powered Applications," *IEEE International Microwave Symposium Digest*, pp. 301-303, June 1992; J. O. McSpadden, 1. Fan, K. Chang, "A High Conversion Efficiency 5.8-GHz Rectenna," *IEEE International Microwave Symposium Digest*, pp. 547-550, June 1982.], signal detection [R. H. Rasshofer, M. o. Thieme, E. M. Biebl, "Circularly Polarized Millimeter-Wave Rectenna on Silicon Substrate," *IEEE Trans. Microwave Theory and Techn.*, Vol. 46, No. 5, pp. 715-718, May 1998.] and wireless control systems [L. W. Epp, A. R. Khan, H. K. Smith, R. P Smith, "A Compact Dual-polarized 8.51-GHz Rectenna for High-Voltage (50 V) Actuator Applications," *IEEE Trans. Microwave Theory and Techn.*, Vol. 48, No. 1, pp. 111-120, January 2000.]. The first receiving device for efficient reception and rectification of microwave power was developed in the early 1960's at Raytheon, based on a half-wave dipole antenna with a balanced bridge or single semiconductor diode placed above a reflecting plane.

An attraction for rectenna technology is its high theoretical conversion efficiency—roughly 95%. The greatest conversion efficiency ever recorded by a rectenna element occurred in 1977 by Brown, Raytheon Company. Using a GaAs—Pt Schottky barrier diode, a 90.6% conversion efficiency was recorded with an input microwave-power level of 8 W. Conversion efficiencies in the range of 80% are typical, with representative circuits shown below.

The concept is arbitrarily scaleable, and the optical rectenna is a direct extension to shorter wavelengths. Some of recent work in the area was performed by ITN energy systems under DOE and DARPA sponsorship "BROADBAND OPTICAL RECTENNA FOR ENERGY HARVESTING", CECOM ENERGY HARVESTING PROGRAM slides, Apr. 14, 2000). Such micro- and nano-scale rectenna devices can convert ambient electromagnetic radiation (i.e. solar spectrum, blackbody radiators, active emitters) to DC electric power. The potential is to convert over 85% of the sun's energy to useable power compared to ~30% now achievable with conventional semiconductor based photovoltaics. Such devices may also be applicable to uncooled infrared detectors.

While the concept has been proven in principal, useful power conversion in the optical frequency range is prevented by the low frequency response of the planar diodes employed.

Thus there remains a need for optical rectennas having desirable frequency response and power conversion.

BRIEF DESCRIPTION OF THE INVENTION

These and other features and advantages of the invention will be apparent to those skilled in the art from the following detailed description of various embodiments, taken together with the accompanying figures and claims, in which:

According to some embodiments, the present invention provides a nanoelectronic device based on a nanostructure that may include a nanotube with first and second ends, a metallic nanoparticle attached to the first end, and an insulating nanoparticle attached to the second end.

The nanotube may be conducting. Thus, it may be any one of conducting, semiconducting, and semi-metallic. Further, the nanotube may be a single walled nanotube or a multi-walled nanotube. The nanotube may be primarily carbon.

The nanotube may absorb light. Yet further, the nanotube may be an antenna. The length between the first and second ends is about half a wavelength of the light. The light may include at least one of visible and infrared radiation.

The insulating nanoparticle may be formed of a metal oxide. The metallic nanoparticle may be formed of elemental metal.

The nanoelectronic device may include additional nanostructures so as to form a plurality of nanostructures comprising the first nanostructure and the additional nanostructures. The plurality of nanostructures may arranged in a network comprising a plurality of edges and a plurality of vertices, wherein each edge comprises a nanotube and each vertex comprises at least one insulating nanoparticle and at least one metallic nanoparticle adjacent the insulating nanoparticle. The combination of at least one edge and at least one vertex comprises a diode. The device may be an optical rectenna.

It will be understood that the above-described features may occur singly or in combination. Thus, for example, according to some embodiments, a nanoelectronic device may include an optical rectenna that may include of a plurality of nanostructures arranged so as to form a plurality of nanoscale diodes with integrated antennas, where each nanostructure may include a conducting nanotube having first and second opposing ends; a metallic or highly conductive nanoparticle attached to the first end, where the first nanoparticle is usually formed of elemental metal; and an insulating nanoparticle attached to the second end, where the insulating nanoparticle usually contains a metal oxide.

According to some embodiments, a method of making a nanoelectronic device may include making a plurality of asymmetric nanostructures, wherein making the plurality of nanostructures may include providing a plurality of nanotubes, each having a first end functionalized with at least one functionalizing moiety and a second end attached to a linker molecule; attaching a metallic nanoparticle to the first end linker molecule; and attaching an insulating nanoparticle to the functionalizing moiety. The method may further include aligning the plurality of asymmetric nanostructures so as to form an oriented network. Alignment may be achieved by electric fields, or by shear fields, when the asymmetric nanostructures are suspended in a fluid.

The present nanoelectronic devices may find application as photoconverters applied in thermovoltaic power sources.

BRIEF DESCRIPTION OF THE DRAWINGS

The foregoing summary as well as the following detailed description of the preferred embodiment of the invention will be better understood when read in conjunction with the appended drawings. It should be understood, however, that the invention is not limited to the precise arrangements and instrumentalities shown herein. The components in the drawings are not necessarily to scale, emphasis instead being placed upon clearly illustrating the principles of the present invention. Moreover, in the drawings, like reference numerals designate corresponding parts throughout the several views.

The invention may take physical form in certain parts and arrangement of parts. For a more complete understanding of the present invention, and the advantages thereof, reference is now made to the following descriptions taken in conjunction with the accompanying drawings, in which.

DETAILED DESCRIPTION OF THE INVENTION

Figure 1:
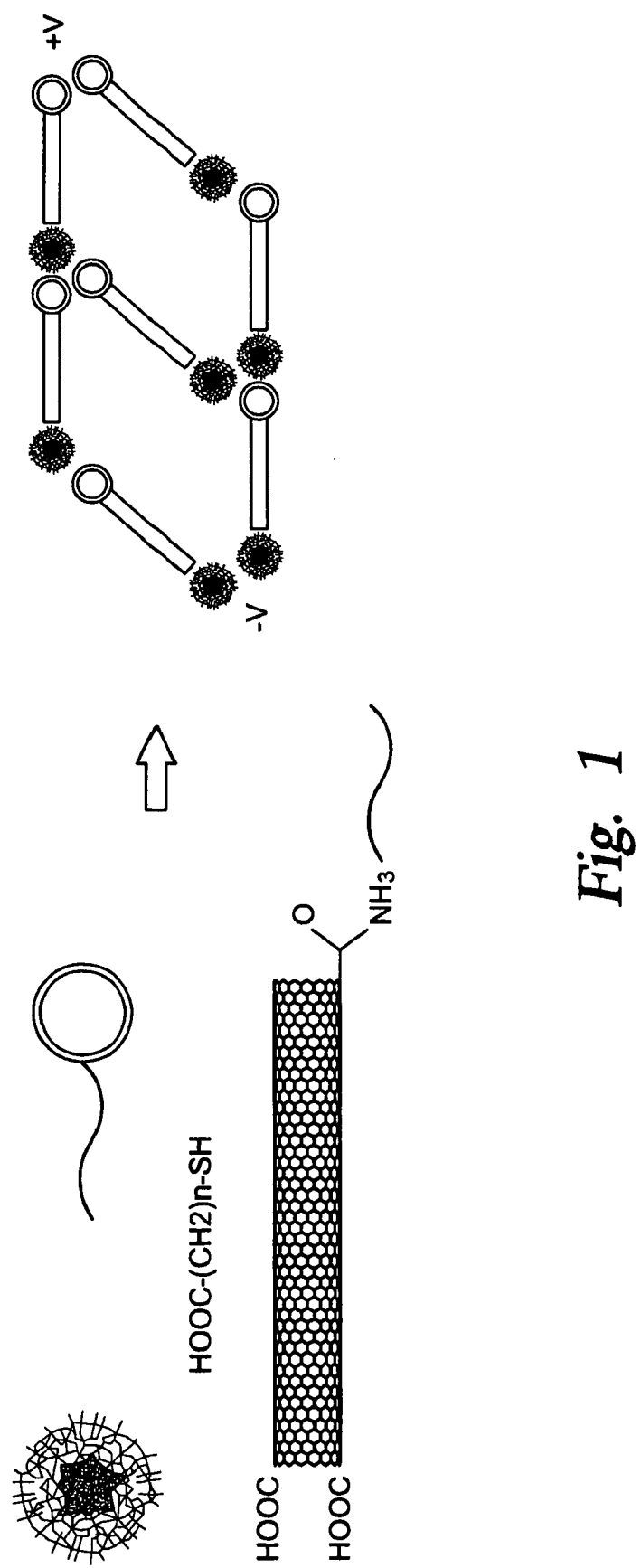
FIG. 1 shows a schematic of some embodiment of chemically directed assembly of a nanoelectronic device.

Referring now to FIG. 1, according to some embodiments, nanoelectronic device 10 includes at least one nanostructure 12 that includes nanotube 14 with a first end 16 and a second end 20. Metallic nanoparticle 22 is attached to first end 16. Insulating nanoparticle 24 is attached to second end 20.

The attachment of metallic nanoparticle 22 to nanotube 14 may be direct, for example, via direct bonding between metallic nanoparticle 22 and nanotube 14, or indirect, for example, via a linker molecule disposed between metallic nanoparticle 22 and nanotube 14. DNA is an exemplary linker molecule. The DNA may be thiol substituted.

The attachment of insulating nanoparticle 24 to nanotube 14 may be direct, for example, via direct bonding between insulating nanoparticle 24 and nanotube 14, or indirect, for example via a functionalizing moiety disposed between insulating nanoparticle 24 and nanotube 14. A carboxyl group is an exemplary functionalizing moiety.

The diameter of metallic nanoparticle 22 may be larger than the cross-sectional diameter of nanotube 14. Further, the diameter of insulating nanoparticle 24 may be larger than the cross-sectional diameter of nanotube 14.

Nanotube 14 may be a cylindrical covalent solid-like material. Nanotube 14 may be inorganic. According to some embodiments, nanotube 14 primarily includes carbon. When nanotube 14 primarily includes carbon the carbons may be primarily $sp^2$ hybridized. Nanotube 14 may have a high degree of cylindrical symmetry. Nanotube 14 may have a high aspect ratio, where the aspect ratio is for example the ratio of length to diameter. Nanotube 14 can be of variable length. Thus, nanotube 14 does not have a fixed molecular weight. Nanotube 14 may be single-walled. Alternatively, nanotube 14 may be multi-walled. When nanotube 14 is multi-walled, it may be any one of double-wall, triple-walled, quadruple-walled, and the like.

Nanotube 14 may be any one of semiconducting, semi-metallic, and metallic. When nanotube 14 is semiconducting, it has a large energy gap in its band structure as compared to kT, where k is the Boltzman constant and T is the temperature. At room temperature, kT is about 30 mV. The bandgap of a typical semiconductor carbon nanotube depends inversely on the diameter of the nanotube. Typical larger diameter carbon nanotubes have of band gap of 0.5 V and typical smaller diameter tubes have a band gap of about 1.25 V. When nanotube 14 is semi-metallic it has a band gap small compared to kT. Typical semi-metallic carbon nanotubes have smaller conductivities than elemental metal conductors such as copper and gold. When nanotube 14 is metallic it has substantially no bandgap at the Fermi energy. For carbon nanotubes, its property as semiconducting, semi-metallic, or metallic depends on the orientation of a elongated graphene sheet rolled into a cylinder with respect to the axis of elongation, conveyed for example by the chiral indices (n,m) known to one of ordinary skill in the art.

Nanotube 14 may capture light. Yet further, nanotube 14 may be an antenna for electromagnetic radiation. The length between the first and second ends is a fraction of the wavelength of light suitable for function as an antenna. For example, nanotube 14 may be about half a wavelength of the light. Alternatively, nanotube 14 may be about one fourth a wavelength of the light. It will be understood that when the light includes radiation of more than one frequency, nanotube 14 may have a length corresponding to any one of the frequencies. According to some embodiments, the light may include at least one of ultra-violet, visible, infrared, THz and microwave radiation.

It will be understood that when nanotube 14 is an antenna, the wavelength of radiation which determines the length of nanotube 14 between first end 16 and second end 20 is the wavelength of the radiation for transmission in nanotube 14. The in tube transmission wavelength is related to the frequency through the group velocity. Typically, the magnitude of the group velocity of light in air is c. Nanotube 14 may capture light through absorption and conversion of the light in a process that may involve transmission of the light through nanotube 14. For larger diameter conducting carbon nanotubes transmission of light through nanotube 14 with a group velocity magnitude about equal to the maximum speed of light, c. For smaller diameter conducting carbon nanotubes, it is known that the small diameter facilitates a quantum inductance effect known as kinetic inductance. For example, the kinetic inductance may be as much as 6 nH/micron. A high kinetic inductance makes the impedance high, which in turn slows down the group velocity. The group velocity may approach the velocity associated via a conventional kinetic relationship with the Fermi energy. This in turn causes a decrease of the effective wavelength used to determine the suitable lengths of such a nanotube for antenna operation. While not wishing to be limited by this example, the present inventor carbon nanotubes with diameters of at least about 10 nm to have a group velocity about equal to c.

When nanoelectronic device 10 includes a plurality of nanotubes 14 and the incident radiation is broadband, the plurality may include an ensemble of lengths. The ensemble may be chosen so as to correspond to the range of frequencies in the light.

Metallic nanoparticle 22 may be formed of a suitable metallic material. The material may be selected so as to be substantially stable against oxidation, so as to remain metallic during operation of nanoelectronic device 10. Suitable materials include elemental metals, such as any one or combination of platinum, palladium, rhodium, chromium, and gold. For example, according to some embodiments, metallic nanoparticle 22 contains elemental gold. Thus, metallic nanoparticle 22 may include a gold colloid. Metallic nanoparticle 22 may further include a passivation layer about the gold colloid. Gold colloid particles are attachable to a linker molecule bound to nanotube 14 via thiol chemistry known to one of ordinary skill in the art.

Insulating nanoparticle 24 may be formed of suitable insulating material. Insulating material may have a band gap sufficiently larger than the thermal energies. Thus, insulating nanoparticle 24 may have, for example, a 3-4 V bandgap. Suitable materials include transitional metal oxides and refractory materials with large band-gaps. For example, according to some embodiments, insulating nanoparticle 24 contains any one or combination of iron oxide, nickel oxide, copper oxide, zinc oxide, silicon dioxide, titanium oxide, niobium oxide, hafnium oxide, aluminum oxide, silicon carbide, aluminum nitride and the like.

It will be understood that an insulating nanoparticle may contain an encapsulated core where the core may be a material based on a metal oxide. For example "FeMoC", an iron oxide based material has been previously experimentally symmetrically attached to carbon nanotubes in work the present inventor participated in. "FeMoC", is a nanocluster having a core of $H_xPMo_{12}]_{40}$ encapsulated by $(O_2CMe)_{15}O_{254}(H_2O)_{98}$.

Nanoelectronic device 10 may include a plurality of nanostructures 14 arranged in a network 28 that may include a plurality of edges 30 and a plurality of vertices 32, wherein each edge 30 may include a nanotube and each vertex 34 may include at least one insulating nanoparticle and at least one metallic nanoparticle 22 adjacent the insulating nanoparticle 24. The combination of at least one edge and at least one vertex may form a nanoscale MIM diode, where MIM denotes metal/insulator/metal. The first metal of the MIM is contained for example in a nanotube 14. The second metal of the MIM is contained for example in a metallic nanoparticle 22. It will be understood that for an array such as illustrated in FIG. 1 each interior vertex that includes two metallic nanoparticles 22 and two insulating nanoparticles 24 may act as a double diode, that is a diode in two different intersecting directions.

Nanoelectronic device may be an optical rectenna. Network 28 may be substantially two dimensional. Network 28 may be a connected network between anode 36 and cathode 38, where the connected network is at least sufficiently connect so as to achieve percolation. It will be understood that some amount of disorder leading to current loops and/or dead ends may be tolerated in a percolated network. Network 28 may be substantially directional, that is asymmetrically oriented between anode 36 and cathode 38. The asymmetry may be associated with the asymmetry of nanostructures 12.

According to some embodiments, a method of making a nanoelectronic device may include making a plurality of asymmetric nanostructures. The method may further include aligning the plurality of asymmetric nanostructures so as to form an oriented network.

A method of making a plurality of asymmetric nanostructures may include providing a plurality of nanotubes, each having a first end functionalized with at least one functionalizing moiety and a second end attached to a linker molecule; attaching a metallic nanoparticle to the first end linker molecule; and attaching an insulating nanoparticle to the functionalizing moiety.

According to some embodiments, when the nanotube is a carbon nanotube and the insulating nanoparticle contains a metal oxide, the functionalizing moiety may be a carboxyl group. Further, according to some embodiments, when the nanotube is a carbon nanotube and the metallic molecule contains a metallic element bondable to sulfur, the linker molecule may be a thiol modified DNA strand. Thus, according to some embodiments, a method of making a plurality of asymmetric nanostructures may include providing a plurality of nanotubes, each having a first end functionalized with at least one carboxyl group and second end attached to a thiol modified DNA strand via the reaction product of the thiol modified DNA strand with a carboxyl group; attaching a metallic nanoparticle to the thiol modified DNA strand; and attaching an insulating nanoparticle to the functionalizing moiety.

A method of providing an asymmetrically substituted carbon nanotube may include pre-functionalizing the carbon nanotube along the sidewalls so as to render it soluble, such as with aryl functional groups according to procedures known to one of ordinary skill in the art. The starting carbon nanotube material may be prepared by the HiPco process known to one of ordinary skill in the art. The carbon nanotubes may be functionalized at the ends with an end selective functionalization. For example, the ends may be functionalized with carboxylic acid by soaking the carbon nanotube in a mixture containing sulfuric acid and nitric acid according to conventional procedures known to one of ordinary skill in the art. A DNA linker molecule is attachable to a carboxyl functionalized carbon nanotube using a hydroxyl group at one end of the DNA via formation of an ester link to the carboxyl moiety. It will be understood that the DNA may be modified with thiol at the end opposite the end that is reacted with the carboxyl moiety. The DNA carboxyl reaction occurs through the mediation of a chemical promoter that activates OH on COOH. An exemplary promoter is a carbodiimide such as 1-Ethyl-3[3-dimethylaaminopropyl]carbodiimide hydrochloride (EDC).

According to some embodiments, the carboxyl functionalized carbon nanotubes and DNA are attached in a one to one ratio of DNA molecules to carboxyl functionalized carbon nanotubes. One average 25% of the product has no DNA attached, 50% has DNA attached at one end, and 25% has DNA attached at both ends. The products may be separated so as to produce a solution substantially pure in the desired asymmetrically substituted carbon nanotubes having at least DNA strand at a first end and at least one carboxyl group at a second end.

It will be understood that the molar ratio of DNA molecules to carboxyl functionalized carbon nanotubes may be varied, producing a different mixture of products for separation. For example, when the ratio is 1 to 10, then substantially all of the DNA substituted carbon nanotubes are substituted at one end. The product mixture in this case is of carbon nanotube lacking DNA and carbon nanotubes substituted with DNA at one end. These may then be separated.

According to some embodiments, a product mixture where most of the DNA substituted carbon nanotubes are substituted at both ends is allowed to form. A method of separating this mixture includes tethering the DNA substituted carbon nanotubes to a substrate through binding the DNA to the substrate, and heating the tethered species to melt off the DNA at one end so as to produce the desired asymmetrically substituted carbon nanotubes having at least DNA strand at a first end and at least one carboxyl group at a second end. The asymmetrically substituted nanotubes can be easily converted back to their native electronic state (a metallic conductor) by pyrolysis in inert atmosphere.

It will be understood that a DNA molecule may be attached to a carbon nanotube one strand at a time. For example, amine terminated DNA may be bound to carbon nanotubes via formation of an amide bond to carboxylic acid groups generated on carbon nanotube ends by peroxide treatment. After selecting for asymmetrically substituted composites complementary thiol-terminated DNA strands are bound to the metallic nanoparticles via well-known sulfur chemistry, e.g sulfur-gold chemistry. Under hybridization conditions, the complementary strands form a duplex with a metallic nanoparticle bound to the DNA. For example, this method has been demonstrated in experimental work the present inventor participated that this method may be used to symmetrically attach gold nanoparticles to a carbon nanotube.

The method for aligning the plurality of asymmetric nanostructures so as to form an oriented network may include directionally assembling the asymmetric nanostructures. The nanostructures may be deposited onto an insulating substrate using conventional methods of spin on coating known to one of ordinary skill in the art. The nanostructures may be deposited such that their longer axes along the length are aligned substantially parallel to the plane of the substrate. Electrophoresis or electric fields may then be used to align or directionally orient the nanostructures. It is known that metallic carbon nanotubes align in electric fields with strengths around a few tenths of a volt per micron. A field that orients the nanostructures weakly may be used in conjunction with allowing the nanotubes sufficient time to anneal. The solution of nanostructures may be provided for coating at a concentration sufficiently large as to achieve a percolated two dimensional network. The solution of nanostructures may be provided at a concentration sufficiently small so as to substantially avoid formation of three dimensional network formation. The solution of nanostructures may be provided at a sufficiently small concentration so as to avoid a parasitic amount of current loops causing shorts.

After depositing and aligning the nanostructures they may be baked so as to burn off the DNA by conventional methods using to burn off organics in the semiconductor industry. This results in direct attachment of the metallic nanoparticle to the nanotube in a nanostructure. Further, in operation, after application of a voltage across a nanostructure, any carboxyl remaining thermalizes. This results in direct attachment of the insulating nanoparticle to the nanotube in a nanostructure.

A method of determining the molar concentration of nanostructures based on carbon nanotubes may include spectroscopically determined the total mass of carbon nanotubes per milliliter using a known well defined relationship between absorbance and concentration by weight to compute the concentration by weight. Typical concentrations by weight of carbon nanotubes are the range of 1 to 10 mg/ml, providing a light grey solution. Knowing the average length of the nanotube solution then provides a reasonable estimate of the number of nanotubes per ml, that is the molar concentration. The molar concentration of a solution of nanostructures based on carbon nanotubes is the same as the molar concentration of the carbon nanotubes divided by the number of carbon nanotubes per nanostructure, typically one.

The nanoelectronic device may be arranged so as operate as an optical rectenna. The optical rectenna may display frequency response some 10,000 times higher than achieved with prior optical rectennae and deliver useful power conversion well into the optical regime at 30,000 TH. The optical rectenna may find application in photovoltaics for conversion of light to electricity.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A nanoelectronic device, comprising:
a first nanostructure, comprising:
   a nanotube having first and second opposing ends;
   a metallic nanoparticle attached to the first end; and
   an insulating nanoparticle attached to the second end.

2. The nanoelectronic device according to claim 1, wherein the nanotube is conducting.

3. The nanoelectronic device according to claim 1, wherein the nanotube absorbs light.

4. The nanoelectronic device according to claim 3, wherein the nanotube comprises an antenna.

5. The nanoelectronic device according to claim 4, wherein the length between the first and second ends is about half a wavelength of the light.

6. The nanoelectronic device according to claim 5, wherein the light comprises at least one of visible and infrared radiation.

7. The nanoelectronic device according to claim 1, wherein the insulating nanoparticle comprises a metal oxide.

8. The nanoelectronic device according to claim 1, wherein the metallic nanoparticle comprises elemental metal.

9. The nanoelectronic device according to claim 1, wherein the nanoelectronic device further comprises additional nanostructures so a to form a plurality of nanostructures comprising the first nanostructure and the additional nanostructures.

10. The nanoelectronic device according to claim 9, wherein the plurality of nanostructures is arranged in a network comprising a plurality of edges and a plurality of vertices, wherein each edge comprises a nanotube and each vertex comprises at least one insulating nanoparticle and at least one metallic nanoparticle adjacent the insulating nanoparticle.

11. The nanoelectronic device according to claim 10, wherein the combination of at least one edge and at least one vertex comprises a diode.

12. The nanoelectronic device according to claim 9, wherein the device is an optical rectenna.

13. A nanoelectronic device comprising an optical rectenna comprising a plurality of nano structures arranged so as to form a plurality of nanoscale diodes with integrated antennas, wherein each nanostructure comprises:
   a conducting nanotube having first and second opposing ends;
   a metallic nanoparticle attached to the first end, wherein the first nanoparticle comprises elemental metal; and an insulating nanoparticle attached to the second end, wherein the insulating nanoparticle comprises a metal oxide.

14. The nanoelectronic device according to claim 13, wherein the conducting nanotube is metallic.

15. The nanoelectronic device according to claim 13, wherein the conducting nanotube is semi-metallic.

16. The nanoelectronic device according to claim 13, wherein the conducting nanotube is semi-conducting.

17. The nanoelectronic device according to claim 13, wherein the conducting nanotube is a single-walled nanotube.

18. The nanoelectronic device according to claim 13, wherein the conducting nanotube is a multi-walled nanotube.

* * * * *